US009494371B2

(12) United States Patent
Werner et al.

(10) Patent No.: US 9,494,371 B2
(45) Date of Patent: Nov. 15, 2016

(54) PUMPED REFRIGERANT COOLING SYSTEM WITH 1+1 TO N+1 AND BUILT-IN REDUNDANCY

(71) Applicant: Liebert Corporation, Columbus, OH (US)

(72) Inventors: Douglas E. Werner, Santa Clara, CA (US);
(Continued)

(73) Assignee: Liebert Corporation, Columbus, OH (US)

( * ) Notice: Subject to any disclaimer, the term of this patent is extended or adjusted under 35 U.S.C. 154(b) by 448 days.

(21) Appl. No.: 13/723,986

(22) Filed: Dec. 21, 2012

(65) Prior Publication Data
US 2013/0168059 A1    Jul. 4, 2013

Related U.S. Application Data

(60) Provisional application No. 61/580,695, filed on Dec. 28, 2011.

(51) Int. Cl.
F25B 7/00    (2006.01)
F28F 7/00    (2006.01)
(Continued)

(52) U.S. Cl.
CPC .................. *F28F 7/00* (2013.01); *B23P 15/26* (2013.01); *F28D 15/0266* (2013.01);
(Continued)

(58) Field of Classification Search
CPC ..................... F25B 38/02; F25B 25/005; F25B 39/02; F25B 6/02; F28D 15/0266
(Continued)

(56) References Cited

U.S. PATENT DOCUMENTS 3,529,432 A * 9/1970 Nussbaum ................ F25B 6/02
62/196.3
3,837,616 A * 9/1974 Castriota-Scanderbeg F16K 1/228
251/175
(Continued)

FOREIGN PATENT DOCUMENTS

CN    1137824 A    12/1996
CN    1625328 A    6/2005
(Continued)

OTHER PUBLICATIONS

Emerson Network Power, "Ensuring Network Availability With Mission-Critical Cooling Technologies;" 2009, pp. 1-32.
(Continued)

*Primary Examiner* — Len Tran
*Assistant Examiner* — Orlando Aviles Bosques
(74) *Attorney, Agent, or Firm* — Harness, Dickey & Pierce, P.L.C.

(57) ABSTRACT

A pumped refrigerant cooling system having cooling units with associated pumping units for providing working fluid to the cooling unit to enable cooling of a space. The pumped refrigerant cooling system also includes a redundant pumping unit which is activated when a primary pumping unit associated with a cooling unit becomes inactive. The primary pumping unit is deactivated in favor of the redundant pumping unit. Once the primary pumping unit is placed in a condition suitable for reactivation, the redundant pumping unit is deactivated, and the primary pumping unit is reactivated.

9 Claims, 12 Drawing Sheets

(72) Inventors: James Hom, Redwood City, CA (US);
Tien-Chih Lin, Fremont, CA (US);
Norman Chow, Milpitas, CA (US);
Richard G. Brewer, Foster City, CA (US);
Brandon R. Leong, Santa Clara, CA (US)

(51) Int. Cl.
*B23P 15/26* (2006.01)
*F28F 27/00* (2006.01)
*F28D 15/02* (2006.01)
*H05K 7/20* (2006.01)

(52) U.S. Cl.
CPC ........... *F28F 27/00* (2013.01); *H05K 7/20827* (2013.01); *Y10T 29/49359* (2015.01)

(58) Field of Classification Search
USPC .......................................... 62/335, 144, 506
See application file for complete search history.

(56) References Cited

U.S. PATENT DOCUMENTS

| | | | | |
|---|---|---|---|---|
| 3,864,919 A | * | 2/1975 | Frutschi | F02C 9/24 60/657 |
| 4,490,836 A | * | 12/1984 | Grotloh | F01D 17/145 137/599.16 |
| 4,765,394 A | * | 8/1988 | Ziegler | F22B 1/1846 122/390 |
| 4,842,017 A | * | 6/1989 | Reynolds | F02C 7/232 137/601.04 |
| 5,247,964 A | * | 9/1993 | DeLange | F16K 5/0605 137/599.05 |
| 6,182,742 B1 | * | 2/2001 | Takahashi et al. | 165/104.33 |
| 7,757,506 B2 | * | 7/2010 | Ellsworth et al. | 62/259.2 |
| 8,120,916 B2 | * | 2/2012 | Schmidt | H05K 7/20827 62/119 |
| 2004/0148956 A1 | * | 8/2004 | Arshansky | F25B 9/008 62/335 |
| 2005/0120737 A1 | | 6/2005 | Borror et al. | |
| 2005/0122684 A1 | * | 6/2005 | Chu et al. | 361/698 |
| 2005/0122685 A1 | * | 6/2005 | Chu et al. | 361/699 |
| 2006/0102322 A1 | | 5/2006 | Madara et al. | |
| 2008/0002364 A1 | * | 1/2008 | Campbell et al. | 361/699 |
| 2009/0038324 A1 | * | 2/2009 | Khalifa | F25B 27/00 62/238.3 |
| 2011/0063792 A1 | * | 3/2011 | Schmidt | G06F 1/20 361/679.46 |
| 2011/0100602 A1 | * | 5/2011 | Kinkel | F24F 5/0007 165/104.19 |
| 2012/0312033 A1 | * | 12/2012 | Lingelbach | F25B 47/025 62/81 |
| 2013/0092640 A1 | * | 4/2013 | Cassidy | A61M 5/36 210/801 |
| 2014/0137582 A1 | * | 5/2014 | Louvar | F25B 25/005 62/119 |

FOREIGN PATENT DOCUMENTS

| | | |
|---|---|---|
| CN | 1890515 A | 1/2007 |
| CN | 101442893 A | 5/2009 |
| CN | 102269444 A | 12/2011 |

OTHER PUBLICATIONS

Chinese Office Action and Search Report for Application No. 2012105991938 dated Mar. 30, 2016, and its English translation thereof.

\* cited by examiner

PUMPED REFRIGERANT COOLING SYSTEM WITH 1+1 TO N+1 AND BUILT-IN REDUNDANCY

CROSS REFERENCE TO RELATED APPLICATIONS

This application claims the benefit of U.S. Provisional Application No. 61/580,695 filed on Dec. 28, 2011. The entire disclosure of the above application is incorporated by reference.

FIELD

The present disclosure relates to pumped refrigerant cooling systems for precision cooling applications having primary cooling circuit redundancy.

BACKGROUND

This section provides background information related to the present disclosure which is not necessarily prior art.

A data center is a room containing a collection of electronic equipment, such as computer servers. Data centers and the equipment contained therein typically have optimal environmental operating conditions, temperature and humidity in particular. A climate control system maintains the proper temperature and humidity in the data center.

The climate control system includes a cooling system that cools air and provides the cooled air to the data center. The cooling system may include air conditioning units, such as computer room air handling (CRAH) or computer room air conditioning (CRAC) units that cool the air that is provided to the data center. The data center may have a raised floor and the cooled air introduced into the data center through vents in the raised floor. The raised floor may be constructed to provide a plenum between the cold air outlet of the CRAH (or CRAHs) or CRAC (or CRACs) and the vents in the raised floor, or a separate plenum such as a duct may be used.

The data center could also have a hard floor. The CRACS may, for example, be arranged in the rows of the electronic equipment, may be disposed with their cool air supply facing respective cold aisles, or be disposed along walls of the data center. The equipment racks in the data center may be arranged in a hot aisle/cold aisle configuration with the equipment racks arranged in rows. The cold air inlets of the racks, typically at the front of the racks, in one row face the cold air inlets of the racks in a row across a cold aisle, and the hot air outlets of the racks in one row face the hot air outlets of the racks in a row across a hot aisle.

One type of cooling system uses a pumped refrigerant cooling unit, such as the cooling units used in the XD System available from Liebert Corporation of Columbus, Ohio. The Liebert XD System has two cooling loops, that may also be referred to as cooling circuits or cycles. A primary loop uses chilled water or a refrigerant, such as R407C and a secondary loop uses a pumped refrigerant, such as R134a. The primary loop includes a fluid to fluid heat exchanger to cool the pumped refrigerant circulating in the secondary loop. The secondary loop includes one or more phase change cooling modules having a fluid to air heat exchanger through which the pumped refrigerant is circulated to cool air flowing across the heat exchanger. The heat exchanger may typically include an evaporator coil and a flow regulator or an expansion valve, in accordance with the particular design.

Basic schematics for the two cooling loops (or cycles) of the Liebert XD System are shown and described in U.S. Ser. No. 10/904,889 for "Cooling System for High Density Heat Load," the entire disclosure of which is incorporated herein by reference. FIGS. 1 and 2 of this application are included herein as FIGS. 1 and 2 along with the accompanying description from this application.

Referring to FIGS. 1 and 2, the disclosed cooling system 10 includes a first cooling cycle 12 (the primary cooling loop) in thermal communication with a second cycle 14 (the secondary cooling loop). The disclosed cooling system 10 also includes a control system 90. Both the first and second cycles 12 and 14 include independent working fluids. The working fluid in the second cycle is any volatile fluid suitable for use as a conventional refrigerant, including but not limited to chlorofluorocarbons (CFCs), hydro fluorocarbons (HFCs), or hydrochloro-fluorocarbons (HCFCs). Use of a volatile working fluid eliminates using water located above sensitive equipment, as is sometimes done in conventional systems for cooling computer room. The second cycle 14 includes a pump 20, one or more first heat exchangers (evaporators) 30, a second heat exchanger 40, and piping to interconnect the various components of the second cycle 14. The second cycle 14 is not a vapor compression refrigeration system. Instead, the second cycle 14 uses the pump 20 instead of a compressor to circulate a volatile working fluid for removing heat from a heat load. The pump 20 is preferably capable of pumping the volatile working fluid throughout the second cooling cycle 14 and is preferably controlled by the control system implemented by controller 90.

The first heat exchanger 30 is an air-to-fluid heat exchanger that removes heat from the heat load (not shown) to the second working fluid as the second working fluid passes through the second fluid path in first heat exchanger 30. For example, the air-to-fluid heat exchanger 30 can include a plurality of tubes for the working fluid arranged to allow warm air to pass therebetween. It will be appreciated that a number of air-to-fluid heat exchangers known in the art can be used with the disclosed cooling system 10. A flow regulator 32 can be connected between the piping 22 and the inlet of the evaporator 30 to regulate the flow of working fluid into the evaporator 30. The flow regulator 32 can be any type of device for regulating flow in the cooling system 10. The flow regulator 32 preferably maintains a constant output flow independent of the inlet pressure over the operating pressure range of the system. In the embodiment of FIGS. 1 and 2, the second cycle 14 includes a plurality of evaporators 30 and flow regulators 32 connected to the piping 22. However, the disclosed system can have one or more than one evaporator 30 and flow regulators 32 connected to the piping 22.

The second heat exchanger 40 is a fluid-to-fluid heat exchanger that transfers heat from the second working fluid to the first cycle 12. It will be appreciated that a number of fluid-to-fluid heat exchangers known in the art can be used with the disclosed cooling system 10. For example, the fluid-to-fluid heat exchanger 40 can include a plurality of tubes for one fluid positioned in a chamber or shell containing a second fluid. A coaxial ("tube-in-tube") exchanger would also be suitable. In certain embodiments, it is preferred to use a plate heat exchanger. The second cycle 14 can also include a receiver 50 connected to the outlet piping 46 of the second heat exchanger 40 by a bypass line 52. The receiver 50 may store and accumulate the working fluid in the second cycle 14 to allow for changes in the temperature and heat load.

In one embodiment, the air-to-fluid heat exchanger 30 can be used to cool a room holding computer equipment. For example, a fan 34 can draw air from the room (heat load) through the heat exchanger 30 where the second working fluid absorbs heat from the air. In another embodiment, the air-to-fluid heat exchanger 30 can be used to directly remove heat from electronic equipment (heat load) that generates the heat by mounting the heat exchanger 30 on or close to the equipment. For example, electronic equipment is typically contained in an enclosure (not shown). The heat exchanger 30 can mount to the enclosure, and fans 34 can draw air from the enclosure through the heat exchanger 30. Alternatively, the first exchanger 30 may be in direct thermal contact with the heat source (e.g. a cold plate). It will be appreciated by those skilled in the art that the heat transfer rates, sizes, and other design variables of the components of the disclosed cooling system 10 depend on the size of the disclosed cooling system 10, the magnitude of the heat load to be managed, and on other details of the particular implementation.

In the embodiment of the disclosed cooling system 10 depicted in FIG. 1, the first cycle 12 includes a chilled water cycle 60 connected to the fluid-to-fluid heat exchanger 40 of the second cycle 14. In particular, the second heat exchanger 40 has first and second portions or fluid paths 42 and 44 in thermal communication with one another. The second path 42 for the volatile working fluid is connected between the first heat exchanger 30 and the pump 20. The first fluid path 44 is connected to the chilled water cycle 60. The chilled water cycle 60 may be similar to those known in the art. The chilled water system 60 includes a first working fluid that absorbs heat from the second working fluid passing through the fluid-to-fluid heat exchanger 40. The first working fluid is then chilled by techniques known in the art for a conventional chilled water cycle. In general, the first working fluid can be either volatile or non-volatile. For example, in the embodiment of FIG. 1, the first working fluid can be water, glycol, or mixtures thereof. Therefore, the embodiment of the second cycle 14 in FIG. 1 can be constructed as an independent unit that houses the pump 20, air-to-fluid heat exchanger 30, and fluid-to-fluid heat exchanger 40 and can be connected to an existing chilled water service that is available in the building housing the equipment to be cooled, for example.

In the embodiment of the disclosed cooling system 10 in FIG. 2, the second cycle 14 is substantially the same as that described above. However, the first cycle 12 includes a vapor compression refrigeration system 70 connected to the first portion or flow path 44 of heat exchanger 40 of the second cycle 14. Instead of using chilled water to remove the heat from the second cycle 14 as in the embodiment of FIG. 1, the refrigeration system 70 in FIG. 2 is directly connected to or is the "other half" of the fluid-to-fluid heat exchanger 40. The vapor compression refrigeration system 70 can be substantially similar to those known in the art. An exemplary vapor compression refrigeration system 70 includes a compressor 74, a condenser 76, and an expansion device 78. Piping 72 connects these components to one another and to the first flow path 44 of the heat exchanger 40.

The vapor compression refrigeration system 70 removes heat from the second working fluid passing through the second heat exchanger 40 by absorbing heat from the exchanger 40 with a first working fluid and expelling that heat to the environment (not shown). The first working fluid can be volatile. For example, in the embodiment of FIG. 2, the first working fluid can be any conventional chemical refrigerant, including but not limited to chlorofluorocarbons (CFCs), hydrofluorocarbons (HFCs), or hydrochloro-fluorocarbons (HCFCs). The expansion device 78 can be a valve, orifice or other apparatus known to those skilled in the art to produce a pressure drop in the working fluid passing therethrough. The compressor 74 can be any type of compressor known in the art to be suitable for refrigerant service such as reciprocating compressors, scroll compressors, or the like. In the embodiment depicted in FIG. 2, the cooling system 10 is self-contained. For example, the vapor compression refrigeration system 70 can be part of a single unit that also houses pump 20 and fluid-to-fluid heat exchanger 30.

During operation of the disclosed system, pump 20 moves the working fluid via piping 22 to the air-to-fluid heat exchanger 30. Pumping increases the pressure of the working fluid, while its enthalpy remains substantially the same. The pumped working fluid can then enter the air-to-fluid heat exchanger or evaporator 30 of the second cycle 14. A fan 34 can draw air from the heat load through the heat exchanger 30. As the warm air from the heat load (not shown) enters the air-to-fluid heat exchanger 30, the volatile working fluid absorbs the heat. As the fluid warms through the heat exchanger, some of the volatile working fluid will evaporate. In a fully loaded system 10, the fluid leaving the first heat exchanger 30 will be a substantially saturated vapor. The vapor flows from the heat exchanger 30 through the piping 36 to the fluid-to-fluid heat exchanger 40. In the piping or return line 36, the working fluid is substantially in the vapor state, and the pressure of the fluid drops while its enthalpy remains substantially constant. At the fluid-to-fluid heat exchanger 40, the vapor in the second fluid path 42 is condensed by transferring heat to the first, colder fluid of the first cycle 12 in the first fluid path 44. The condensed working fluid leaves the heat exchanger 40 via piping 46 and enters the pump 20, where the second cycle 14 can be repeated.

The first cooling cycle 12 operates in conjunction with second cycle 14 to remove heat from the second cycle 14 by absorbing the heat from the second working fluid into the first working fluid and rejecting the heat to the environment (not shown). As noted above, the first cycle 12 can include a chilled water system 60 as shown in FIG. 1 or a vapor compression refrigeration system 70 as shown in FIG. 2. During operation of chilled water system 60 in FIG. 1, for example, a first working fluid can flow through the first fluid path 44 of heat exchanger 40 and can be cooled in a cooling tower (not shown). During operation of refrigeration system 70 in FIG. 2, for example, the first working fluid passes through the first portion 44 of fluid-to-fluid heat exchanger 40 and absorbs heat from the volatile fluid in the second cycle 14. The working fluid evaporates in the process. The vapor travels to the compressor 74 where the working fluid is compressed. The compressor 74 can be a reciprocating, scroll or other type of compressor known in the art. After compression, the working fluid travels through a discharge line to the condenser 76, where heat from the working fluid is dissipated to an external heat sink, e.g., the outdoor environment. Upon leaving condenser 76, refrigerant flows through a liquid line to expansion device 78. As the refrigerant passes through the expansion device 78, the first working fluid experiences a pressure drop. Upon leaving expansion device 78, the working fluid flows through the first fluid path of fluid-to-fluid heat exchanger 40, which acts as an evaporator for the refrigeration cycle 70.

Data center providers are continually seeking increased reliability and up time from climate control systems. Therefore, data center providers continually desire improved redundancy in the climate control systems to guard against unnecessary down time of the cooled electronic equipment due to unexpected interruption in operation of the climate control systems. One mode of redundancy is to replicate each element of a cooling system, such as the first cooling cycle 12 and the second cooling cycle 14. Such complete redundancy can be prohibitively expensive and greatly complicates the design, implementation, and control of the cooling systems. In various configurations, redundancy may include implementation of a cooling loop, including a second, reduced implementation of a second cooling cycle 14 such as shown in FIGS. 1 and 2. The reduced redundancy could include a second pump unit 20 and half of the heat exchangers provided in the primary cooling system. Implementing this redundant system would also require the associated plumbing and controls. Accordingly, an approximate cost of such a system could be in the range of 50% of the total cost of the base cooling load.

Another approach to redundancy in order to minimize equipment can include over-provisioning the environment by deploying cooling modules in complicated, interweaved schemes. Failure of one cooling loop can then be covered by other cooling loops interwoven into the zone of the failed one cooling loop. Such over provisioning again provides increased cost to the consumer which includes extra pumps, cooling modules, plumbing, piping and control systems over conventional configurations shown in FIGS. 1 and 2.

SUMMARY

This section provides a general summary of the disclosure, and is not a comprehensive disclosure of its full scope or all of its features.

A cooling system that cools a load having a primary cooling module that circulates refrigerant to the load. If the primary cooling module is to be deactivated, a redundant cooling module provides a flow of refrigerant to the load upon deactivation of the primary cooling module. The primary cooling module can be reactivated in favor of the secondary cooling module. When this occurs, the secondary cooling module is disabled. The redundant cooling module is arranged to provide fluid flow to any of the loads in the cooling system.

The primary cooling and secondary cooling modules each further include a pump for circulating refrigerant, the pump supplying refrigerant to a load at a first temperature. The primary and secondary modules also each include a condenser for receiving refrigerant from the load. The refrigerant received by the condenser being at a higher temperature than the first temperature. The primary and secondary modules also each include a liquid receiver that receives refrigerant in a liquid state from the condenser.

A cooling system that cools a load having a cooling module that circulates refrigerant to the load. The primary cooling module has a pair of circuits including a controller, a pump, and at least one valve. The pair of circuits shares a common condenser and receiver. The pair of circuits operates redundantly so that if one circuit is not functioning, the other circuit operates to control fluid flow through the cooling module.

A cooling system that includes a primary cooling module, the primary cooling module supplying refrigerant to a load. The cooling system also includes a first liquid receiver associated with the primary cooling module and receiving refrigerant in a liquid state. A secondary cooling module provides a supplemental flow of refrigerant through the load upon detection of a deficiency of the primary cooling.

A cooling system including a plurality of primary cooling modules. The primary cooling modules supplying refrigerant through a respective one of a plurality of thermal loads. A plurality of liquid receivers associated with the respective primary cooling modules receive refrigerant in a liquid state. A secondary cooling module selectively provides a supplemental flow of refrigerant through the load associated with a primary cooling module for which a failure has been detected. Each primary cooling module further includes a plurality of first pumps for supplying refrigerant. The plurality of first pumps supply refrigerant at a first temperature to the respective loads associated with the respective primary cooling module. A plurality of second condensers receive refrigerant from the respective loads associated with the respective primary cooling modules. The refrigerant received by the respective condensers being at a higher temperature than the first temperature.

A method for providing redundant cooling in a cooling system includes providing a primary cooling module having a circuit, the primary cooling module providing cooling fluid to a thermal load. The method further includes providing a secondary cooling module and initiating operation of the secondary cooling module. The method further includes inserting the secondary cooling module into the circuit, the secondary cooling module providing cooling fluid to the thermal load. Controlling primary receiver valve between a primary receiver associated with the primary cooling module and a secondary receiver associated with the secondary cooling module to equalize pressure between the primary receiver and the secondary receiver prior to inserting the secondary cooling module into the circuit. The method further includes deactivating the primary cooling module.

A method for providing redundant control of a cooling system includes providing a plurality of primary cooling modules, the primary cooling modules supply refrigerant through a respective thermal load. The method further includes providing a plurality of liquid receivers corresponding to a respective primary cooling module, each liquid receiver receiving refrigerant in a liquid state from a respective condenser associated with a respective primary cooling module. A secondary cooling module selectively provides a supplemental flow of refrigerant through the load associated with a selected primary cooling module.

An apparatus that includes a cooling module, the cooling module supplying refrigerant through a load. A first controller is associated with a first portion of a circuit associated with the cooling module. A second controller is associated with a second portion of a circuit associated with the cooling module. In a first mode, the first controller controls the first portion of the circuit, and the second controller controls the second portion of the circuit. In a second mode, one of the first controller or the second controller controls both the first and second portions or an other of the first portion of the circuit or the second portion of the circuit.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Figure 1:
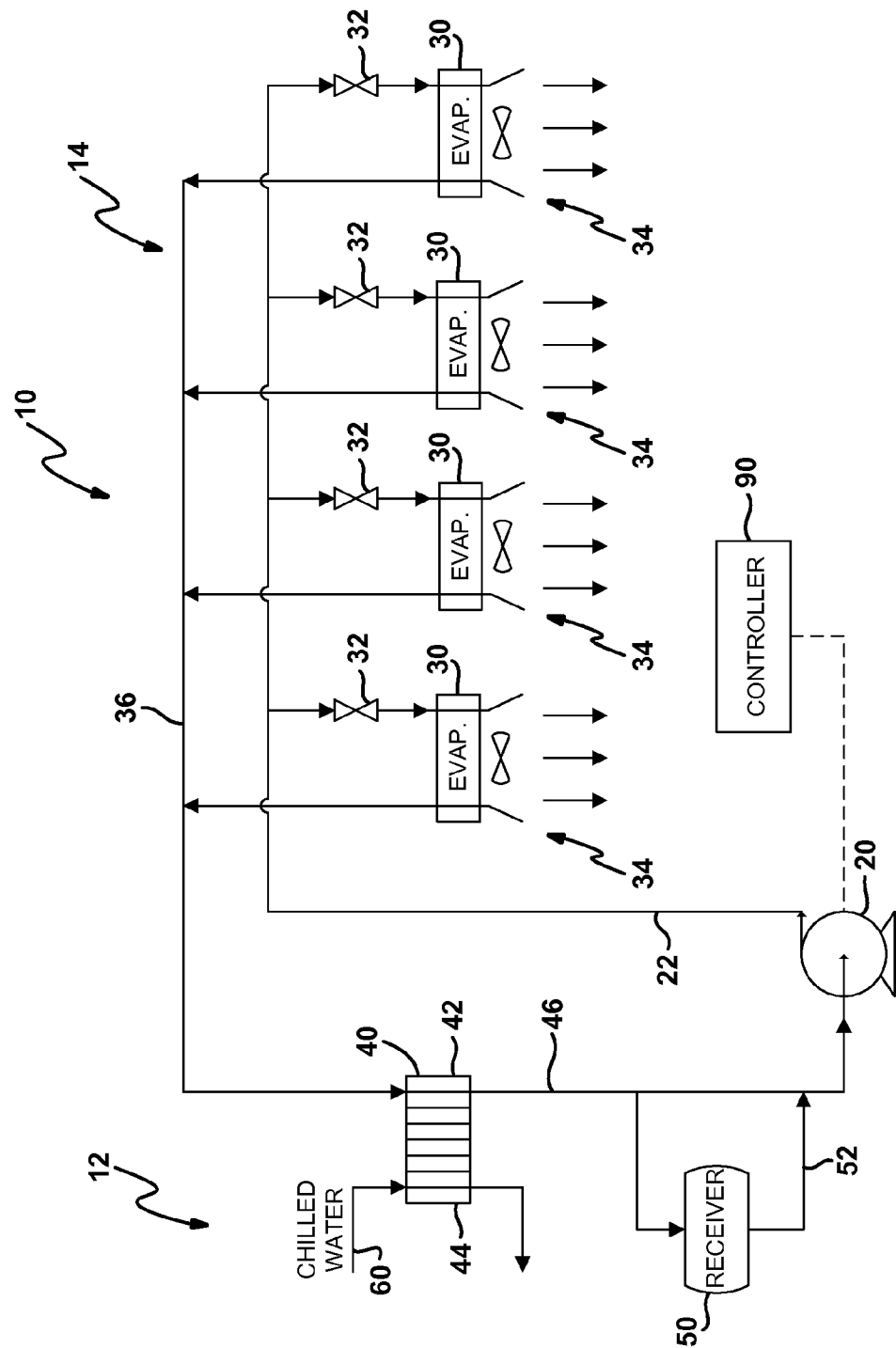
FIG. 1 is a schematic view of a primary cooling loop connected to a chilled water cycle.

Example embodiments will now be described more fully with reference to the accompanying drawings.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

Figure 3:
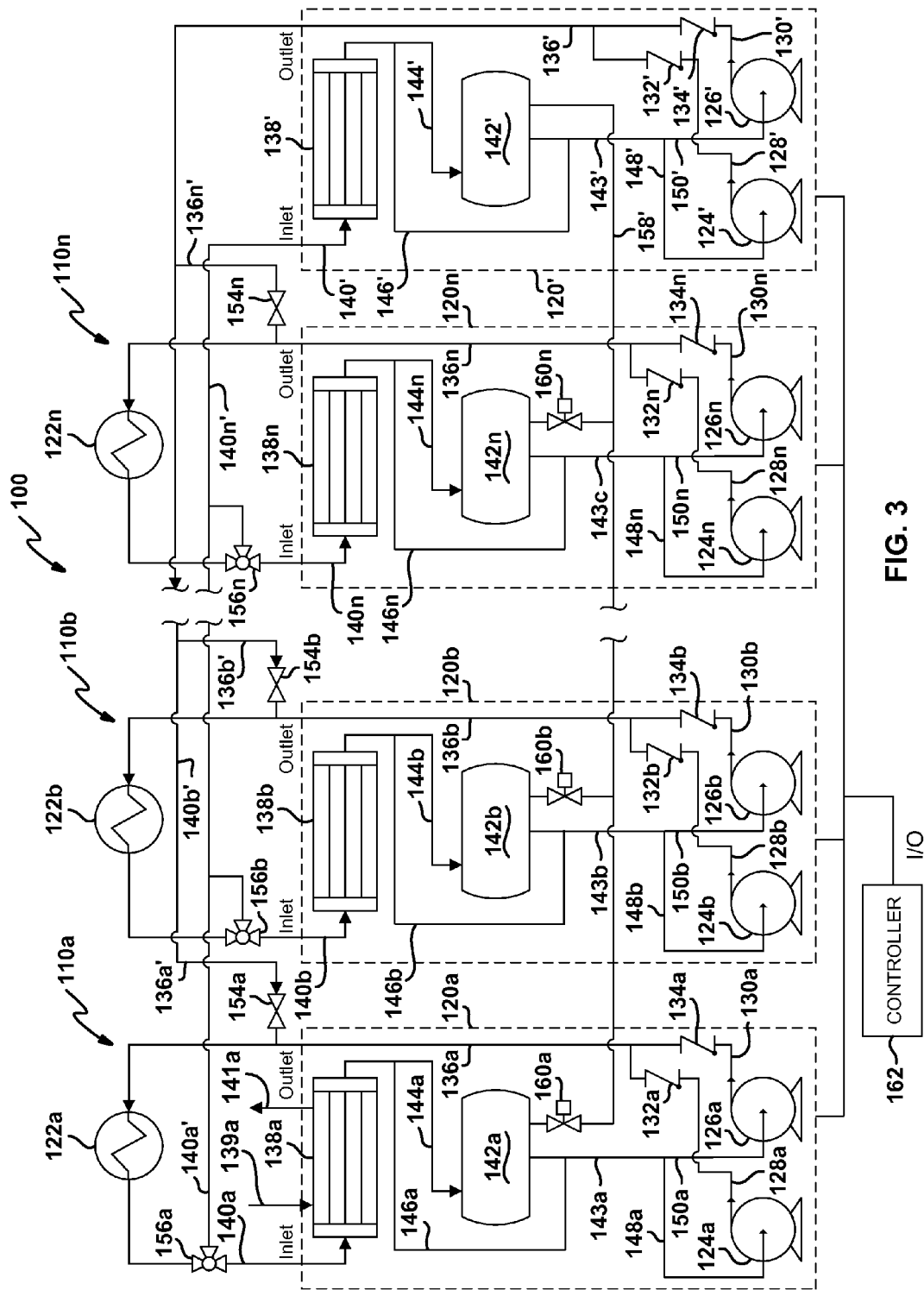
FIG. 3 is a schematic view of a cooling system arranged according to a first configuration.

FIG. 3 depicts a schematic view of a pumped refrigerant cooling system 100 having a redundant pumping unit. The pumped refrigerant cooling system 100 includes a plurality of cooling subsystems 110a, 110b, . . . , 110n, each having respective primary pumping units 120a, 120b, . . . , 120n. Each primary pumping unit 120a, 120b, . . . , 120n provides a working fluid pumped to a heat exchanger or cooling unit 122a, 122b, . . . , 122n. Each cooling unit 122a, 122b, . . . , 122n is placed in an environment to be cooled, such as a data room. It should be noted that n can be any positive integer and represents a selected number of similarly arranged elements in the figures. For example, pumping units 120a, 120b, . . . , 120n refer to N pumping units. One skilled in the art would recognize that the number of pumping units can be varied depending on the particular implementation of the pumped refrigerant cooling system 100 described herein. This numbering convention will be used to describe other similar units. In some instances, the n (or other number of) units may be described collectively using the reference numeral without the a, b, . . . , n. Further, like reference numerals will be used to describe similar elements throughout the specification.

Each main pumping unit 120 includes a first pump 124 and a second pump 126 which pump the working fluid at an elevated pressure to respective check valves 132, 134.

Pumps 124, 126 can be arranged in a first, redundant configuration. Alternatively, pumps 124, 126 can be arranged to cooperatively apply fluid at an output pressure and fluid flow through respective check valves 132, 134 to output line 136. Pumps 124, 126 can be controlled to provide both redundant and cooperative operation. In various embodiments, a main pumping unit can be configured to omit one of pumps 124, 126.

Fluid pumped through output line 136 is applied to cooling unit 122. Cooling unit 122 may assume a number of configurations, including a configuration similar to evaporator 30 of FIGS. 1 and 2. Cooling unit 122 is placed in an environment where it is desirable to remove heat from the environment in which cooling unit 122 is situated by transferring the heat to fluid pumped through output line 136. Fluid from output line 136 enters cooling unit 122 at a first temperature and exits cooling unit 122 on line 140 at an elevated temperature. Fluid pumped through cooling unit 122 may also change phase from a liquid phase to a gaseous phase. Line 140, generally referred to as inlet line 140, returns the working fluid to main pumping unit 120.

Fluid in inlet line 140 is input to condenser 138. Condenser 138 receives the working fluid in a first state having a first density (such as a gas) and rejects the heat in the working fluid to output fluid in a second state at a higher density (such as a liquid). The fluid passing through condenser 138 changes phase from a gaseous to a liquid phase. Condenser 138 receives a supply of chilled water from chilled water inlet line 139 (shown at pumping unit 120 in FIG. 3). Chilled water is circulated through condenser 138 to remove heat from the working fluid received from inlet line 140. Chilled water is returned from condenser 138 to the chilled water supply via chilled water outlet line 141 (shown in pumping unit 120 in FIG. 3). The output of condenser 138 is output through return line 144 which is input to receiver 142. Receiver 142 restores working fluid for use by pumping unit 120. Receiver 142 returns working fluid to respective pumps 124, 126 via receiver output line 143. A bypass line 146 bypasses receiver enabling fluid to pass from the outlet of condenser 138 directly to receiver output line 143, bypassing receiver 142. Receiver output line 143 provides working fluid to pumps 124, 126 via respective pump input lines 148, 150.

Figure 2:
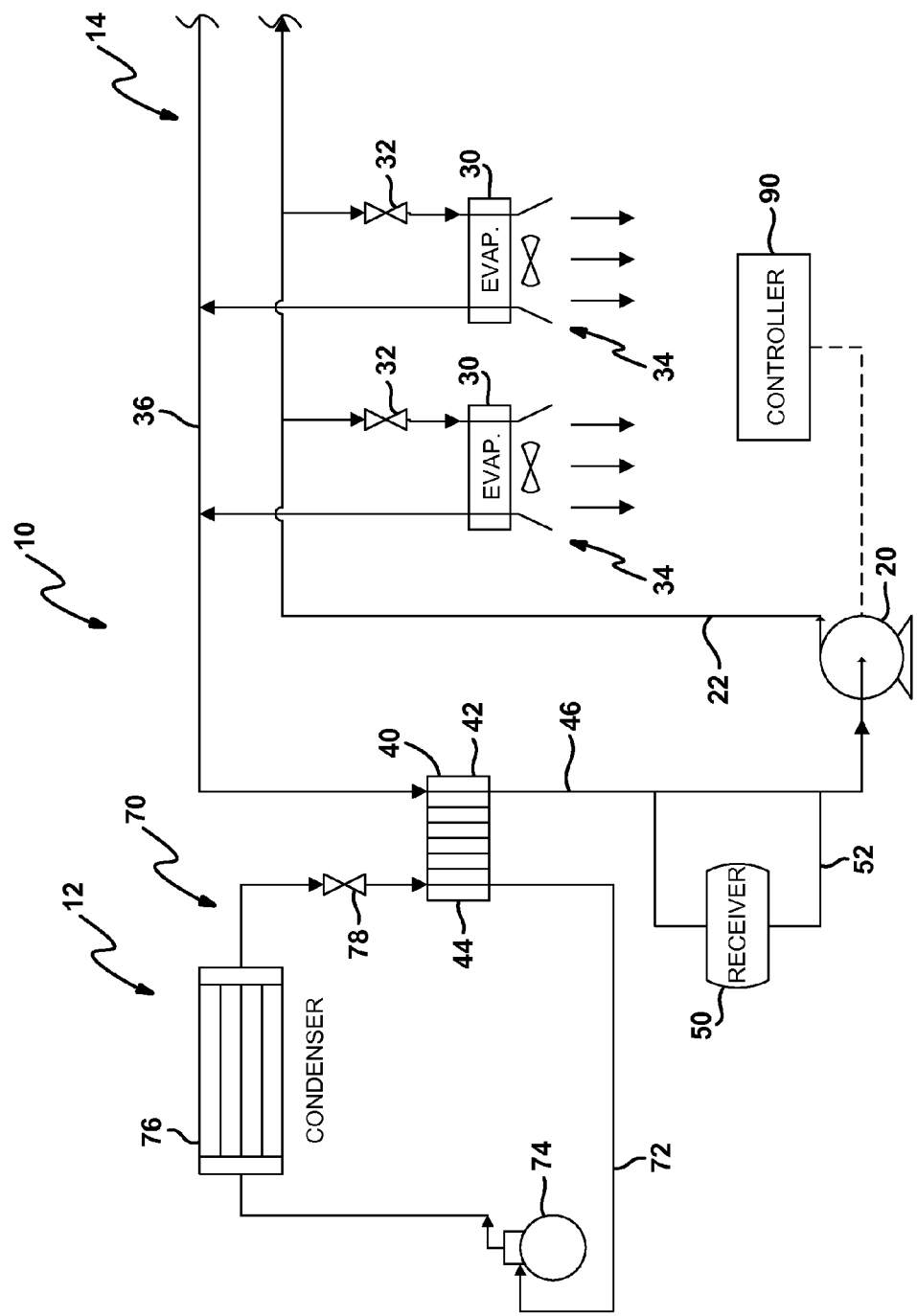
FIG. 2 is a schematic view of a cooling system having a primary cooling loop utilizing a vapor compression refrigeration system.

In addition to main pumping units 120a, 120b, . . . , 120n, a redundant pumping unit 120' is included in the pumped refrigerant cooling system 100 of FIG. 1. Redundant pumping unit 120' provides working fluid at a pressure in the event that any of main pumping units 120a, 120b, . . . , 120n should become inactive. In this manner, pumping unit 120' provides redundancy to the other pumping units, thereby maintaining up-time and providing a cooling function for any of the cooling units 122 associated with the deactivated main pumping unit.

Redundant pumping unit 120' is configured similarly to the above-described pumping unit 120. Pumping unit 120' also includes a liquid line 136' output to each of cooling units 122a, 122b, . . . , 122n. Liquid line 136' connects to each of liquid lines 136a, 136b, . . . , 136n through respective gate valves 154a, 154b, . . . , 154n. Redundant pumping unit 120' also receives working fluid via vapor line 140'. Vapor line 140' connects to each of vapor lines 140a, 140b, . . . , 140n through respective mixing valves 156a, 156b, . . . , 156n. Redundant pumping unit 120' also includes a redundant receiver link 158' which links to receivers 142a, 142b, . . . , 142n through each of respective valves 160a, 160b, . . . , 160n. A controller 162 sends and receives monitoring and control signals to selected components of pumped refrigerant cooling system 100 in order to affect control of pump refrigerant cooling system 100.

Figure 4:
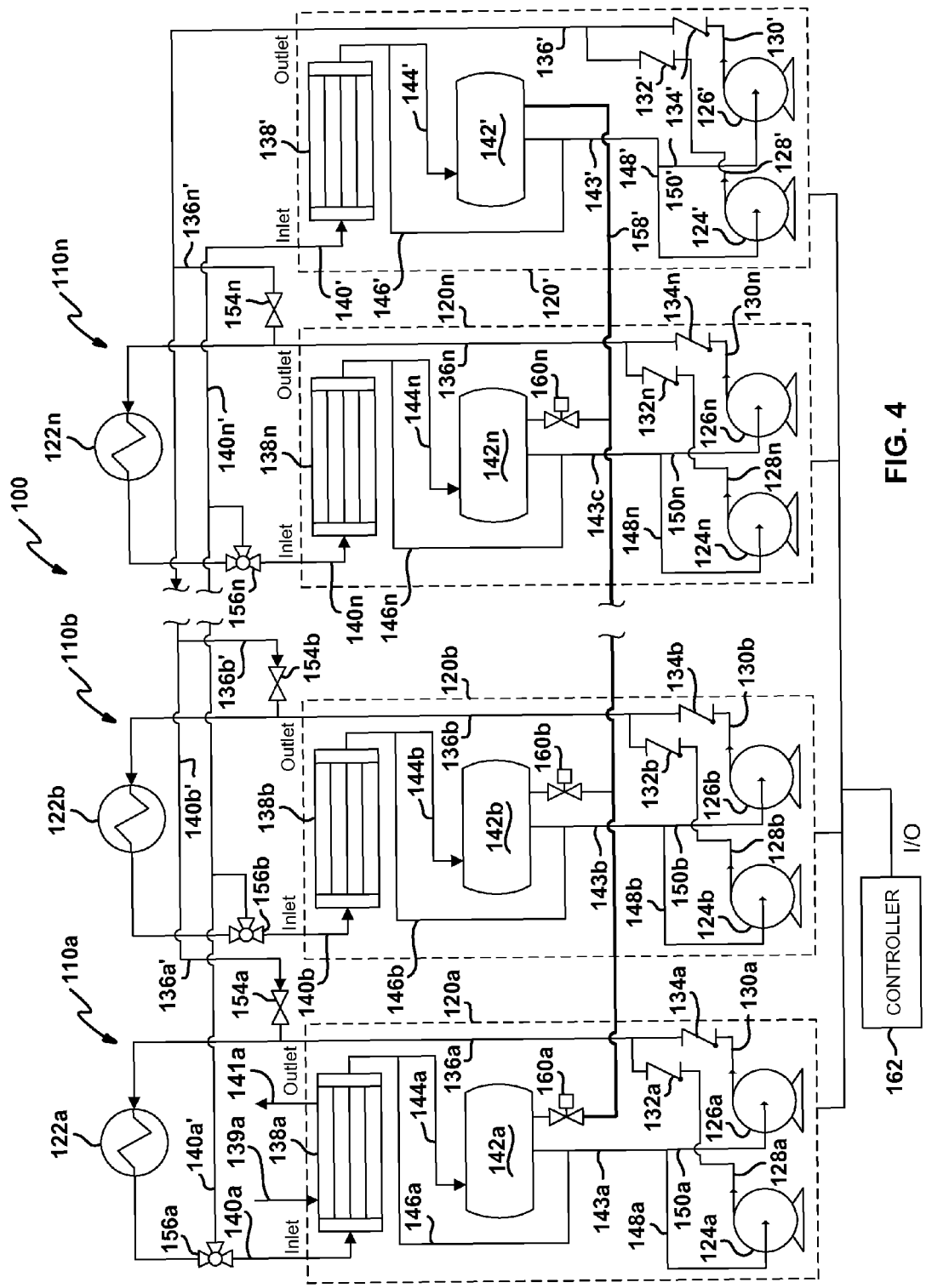
FIG. 4 is a schematic view of the cooling system of FIG. 3 in which the redundant pumping unit is primed for operation.

Operation of the system will be described with respect to FIGS. 4-7. When a unit has become or must be deactivated because various operational conditions of a main pump unit 120, redundant unit 120' is activated to replace the deactivated main pumping unit. For example, if main pumping unit 120a requires deactivation, redundant pumping unit 120' would be activated to provide the pumping function for deactivated main pumping unit 120a. When this occurs, valve 160a is opened to connect receiver 142a with receiver 142', as shown in FIG. 4, to enable pressure equalization between receivers 142a and 142'. Equalization occurs through receiver link 158' as indicated by the thickened lines in FIG. 4. After a predetermined time period, pressure is equalized between receiver 142a of main pumping unit 120a and receiver 142' of redundant pumping unit 120'.

Figure 5:
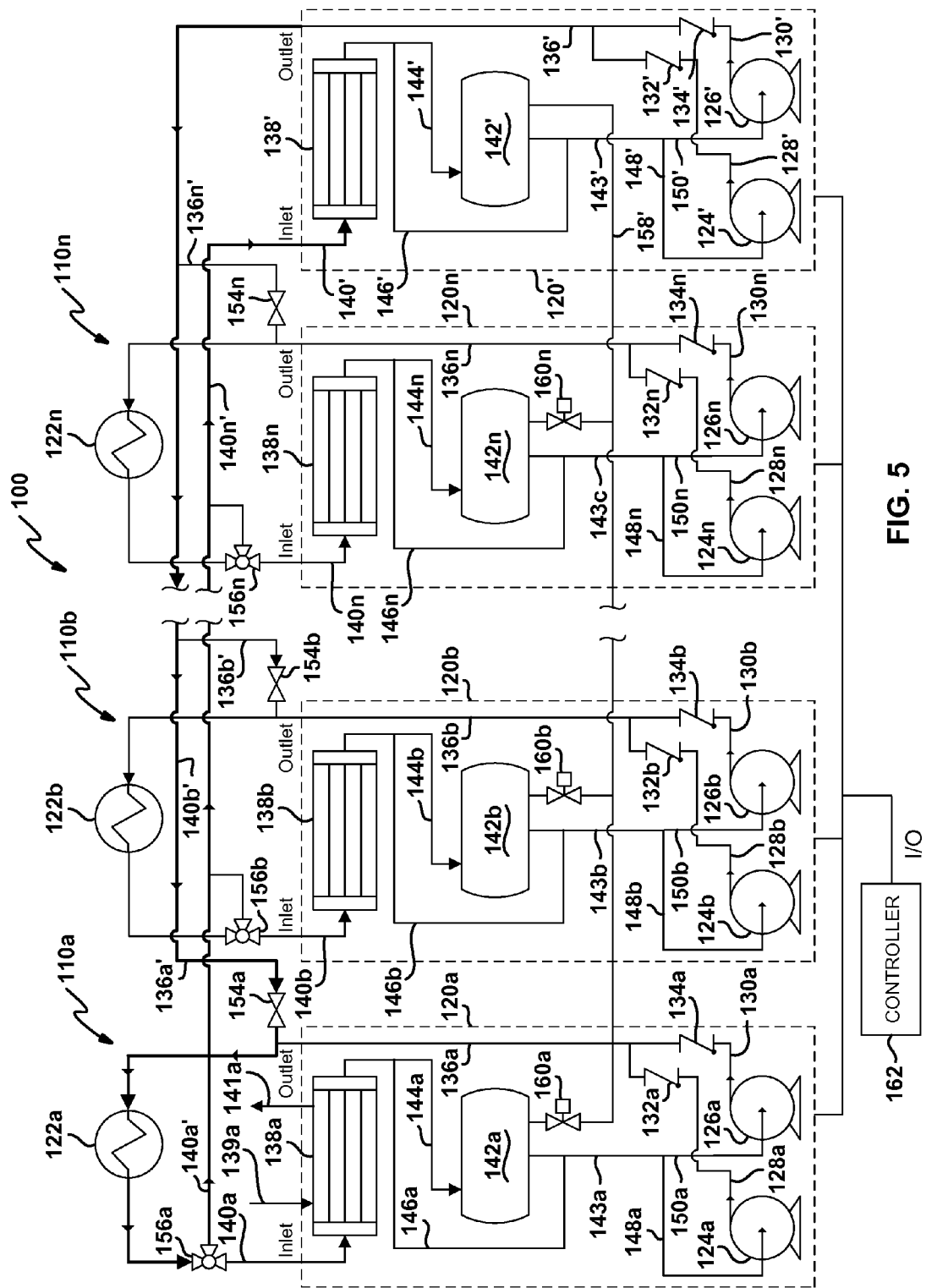
FIG. 5 is a schematic view of the cooling system of FIG. 3 showing the redundant pumping unit and load following deactivation of a main pumping unit.

Once pressure is equalized, redundant pumping unit 120' powers up to supply the pumping function for cooling unit 122a associated with the main pumping unit 120a. As shown in FIG. 5, in order for redundant pumping unit 120a to provide a pumping function for cooling unit 122a, valve 156a is switched so that the working fluid, typically in the form of a vapor, output from cooling unit 122a is directed to condenser 138' of redundant pumping unit 120'via vapor line 140'. Also during the switch over to redundant pumping unit 120', valve 154a is opened so that the liquid line 136' provides working fluid, typically in a liquid state, to cooling unit 122a. The switching of valves 156a and 154a enables redundant pumping unit 120' to provide a pumping function for the main pumping unit 120a. The redirected fluid flow indicative of redundant pumping unit 120' providing a pumping function for deactivated main pumping unit 120a. This is shown by the thickened lines in FIG. 5. Main pumping unit 120a can then be deactivated. Receiver valve 160a is then closed.

Once it is determined to reactivate main pumping unit 120a, thereby requiring deactivation of redundant pumping unit 120', a similar process to that described above occurs.

Figure 6:
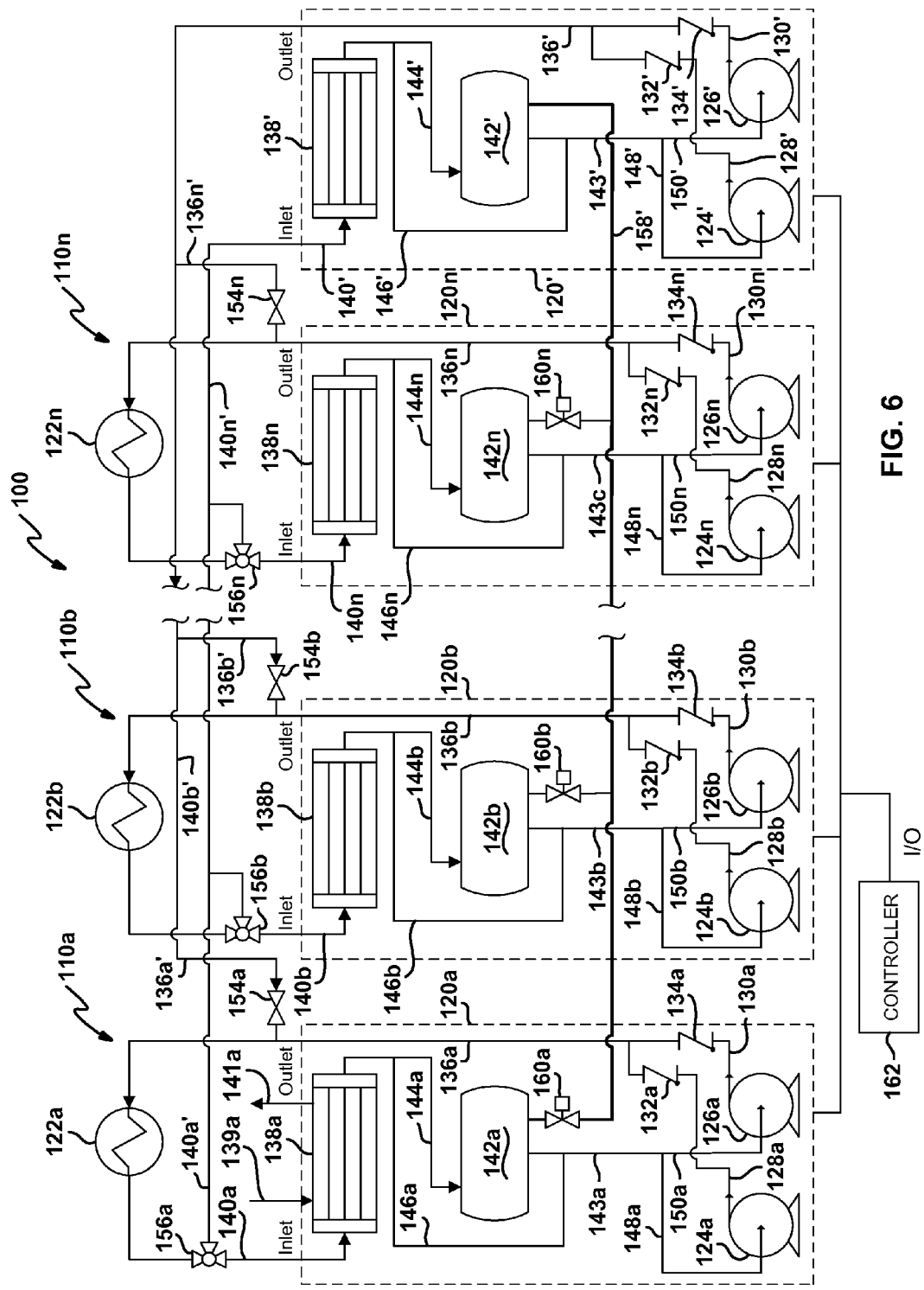
FIG. 6 is a schematic view of the cooling system of FIG. 3 in which the deactivated, main pumping unit is primed for reactivation.
Figure 7:
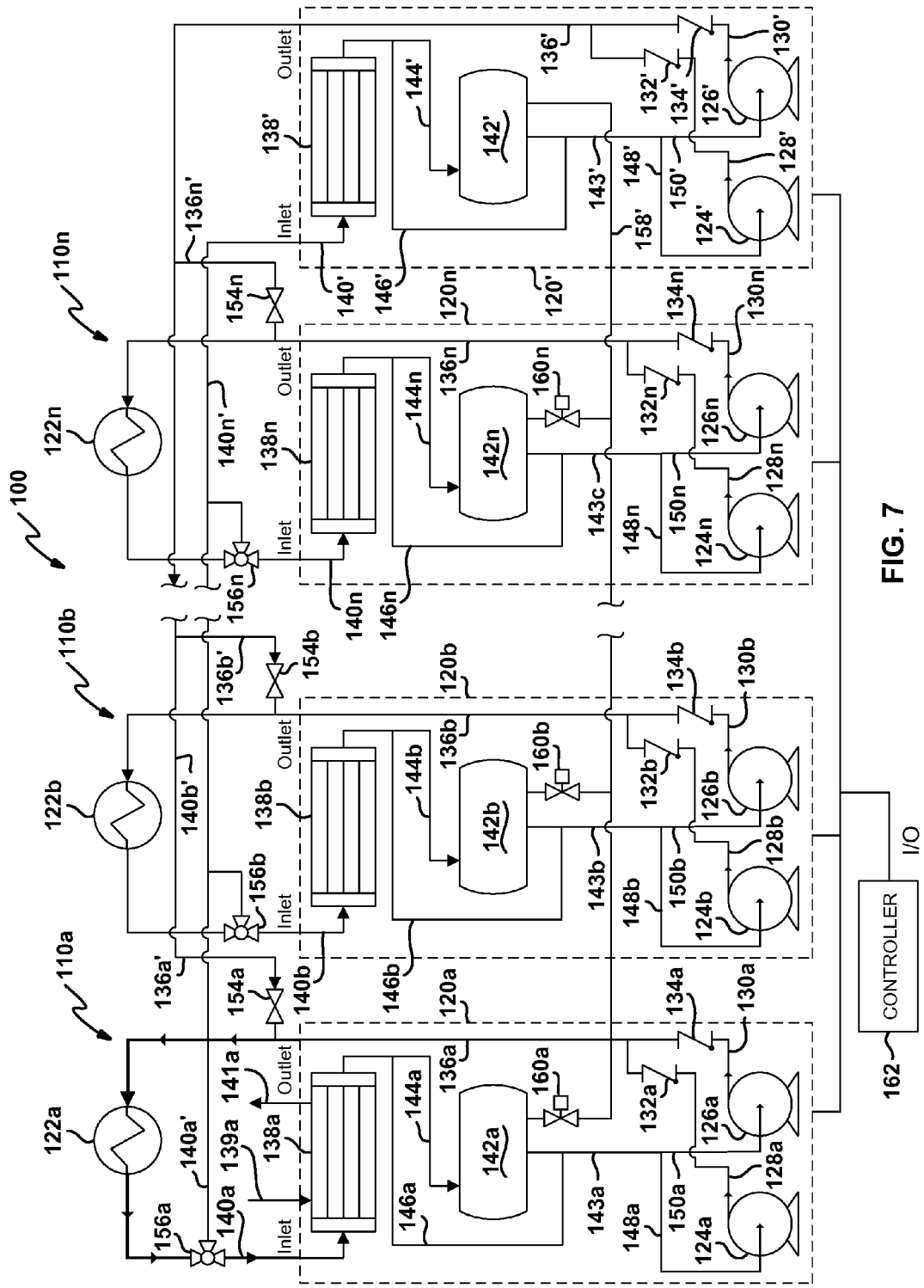
FIG. 7 is a schematic view of the previously disabled main pumping unit returned to operation.

To initiate the process of returning deactivated main pumping unit 120a to an operational condition, receiver valve 160a is opened to allow pressure to equalize between receiver 142a of pumping unit 120a and receiver 142' of redundant pumping unit 120'. This is indicated in FIG. 6 in which fluid flow in receiver link 158' to equalize pressure is shown in thickened lines. In various embodiments, receiver valves 160 can be arranged in a normally open configuration and selectively closed to isolate a specific, associated receiver 142. Once the pressure has equalized, main pumping unit 120a is then powered up so that working fluid is pumped through the fluid circuit of pumping unit 120a. In order to cause this transition, valve 156a is adjusted to close off the connection between the output of cooling unit 122a and redundant vapor line 140a'. This directs fluid from the outlet of cooling unit 122a to the inlet of pumping unit 120a and condenser 138a. Also, valve 154a is closed so that the outlet of pumping unit 120a provides working fluid to the input of cooling unit 122a through liquid line 136a. The closing of valve 154a also cuts off the flow of working fluid on redundant vapor line 136'. Receiver valve 160a of pumping unit 120a is also closed to cut off the fluid connection between receiver 142a of pumping unit 120a and receiver 142' of redundant pumping unit 120'. Thus, pumping unit 120a is returned to operation as shown by the thickened lines of FIG. 7.

Figure 8:
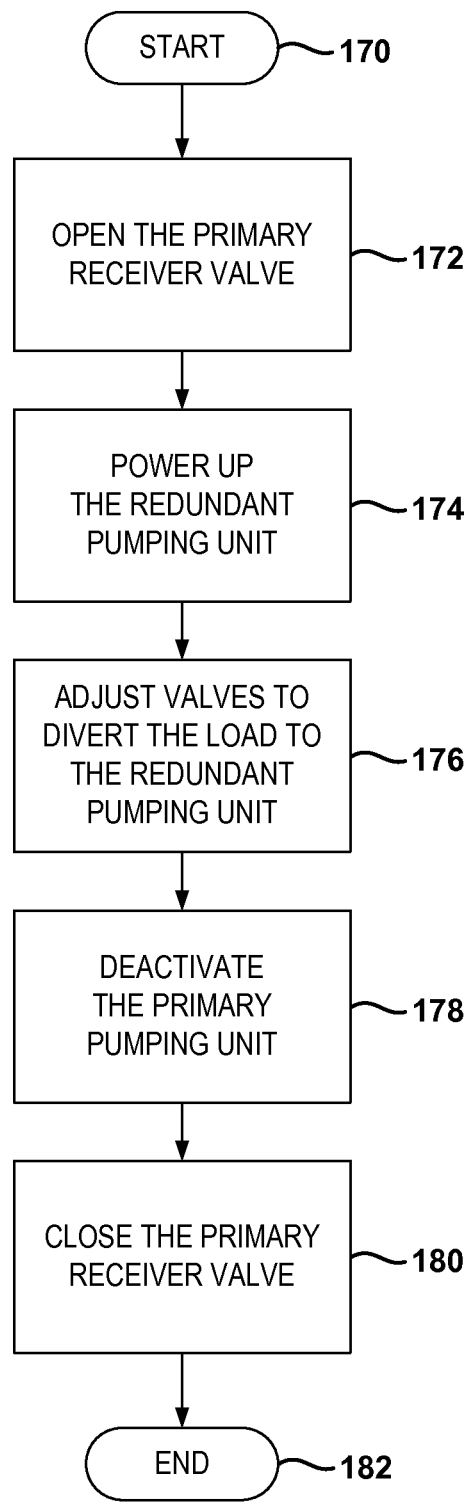
FIG. 8 is a flow diagram depicting FIG. 3 in which a process for activating a redundant pumping unit and deactivating a main pumping unit.

FIG. 8 provides a flow chart of a non-limiting example of a process for switching from a primary pumping unit to a redundant pumping unit. Control starts at block 170 and proceeds to block 172. Block 172 equalizes the receiver pressure between the primary pumping unit to be deactivated and the redundant pumping unit to be activated. Control then proceeds to block 174 which powers up the redundant pumping unit. Once the redundant pumping unit is powered up, control proceeds to block 176 where control valves are arranged to divert fluid flow to the redundant pumping unit away from the primary pumping unit. Control then proceeds to block 178 where the primary pumping unit is deactivated. In some embodiments, following deactivation of the primary pumping unit, control proceeds to block 180 where the primary receiver valve is closed. The process ends at block 182.

Figure 9:
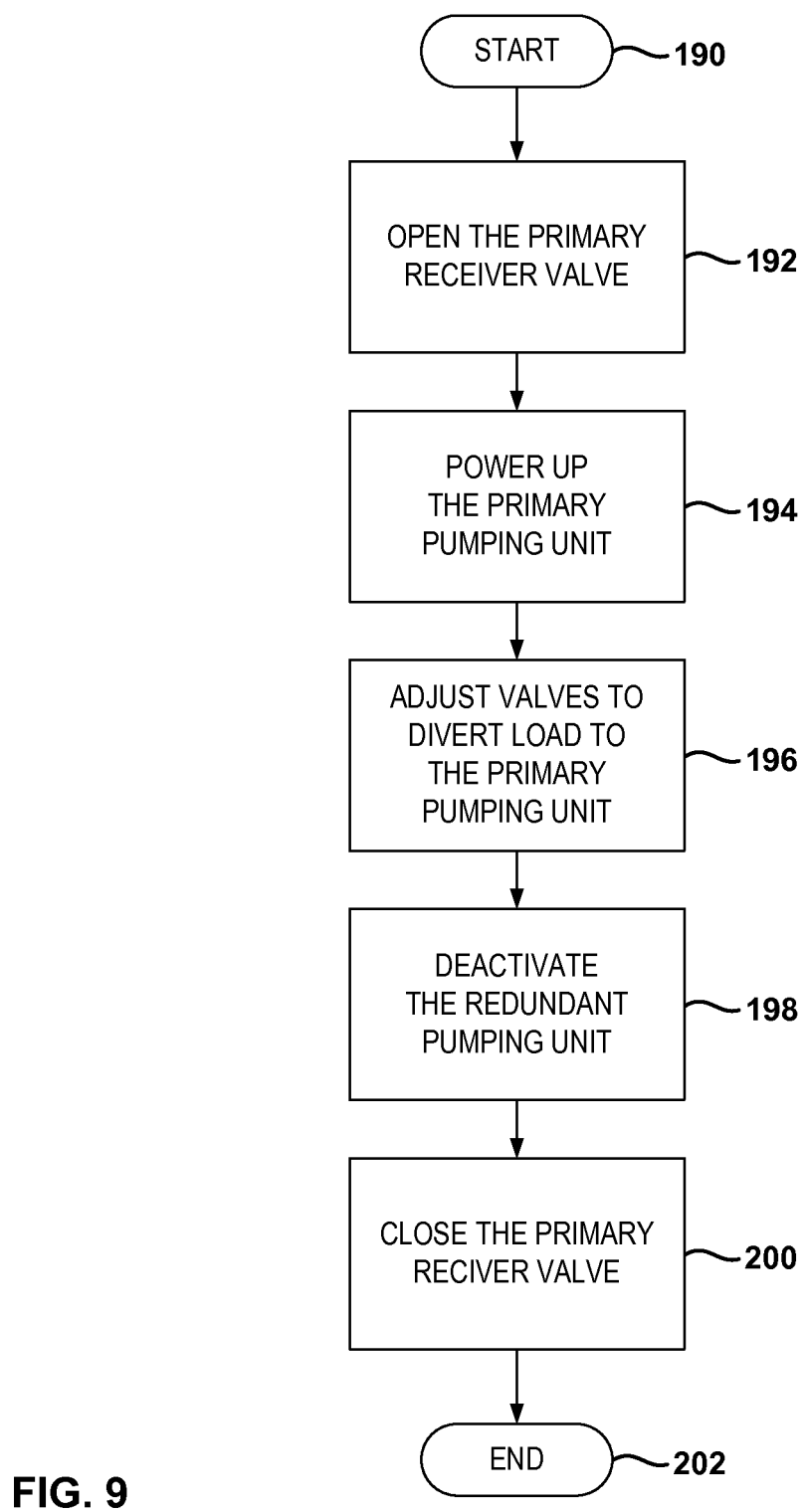
FIG. 9 is a flow diagram depicting a process for activating a main pumping unit and deactivating a redundant pumping unit.

FIG. 9 depicts a block diagram of a non-limiting example for returning the primary pump to an activated state communicating with the cooling unit and deactivating the redundant pumping unit. Control begins at start block 190 and proceeds to block 192 which equalizes the receivers for the respective redundant pumping unit to be deactivated and the primary pumping unit to be activated. Control then proceeds to block 194 where the primary pumping unit is powered up in anticipation of the changeover. Following powerup of the primary pumping unit, control proceeds to block 196 which changes the valves to divert the fluid flow to the primary pumping unit and away from the redundant pumping unit. Control then proceeds to block 198 where the redundant pumping unit is then deactivated. In some embodiments, following deactivation of the redundant pumping unit, control proceeds to block 200 where the primary receiver valve is closed. Control then proceeds to end block 202.

Figure 10:
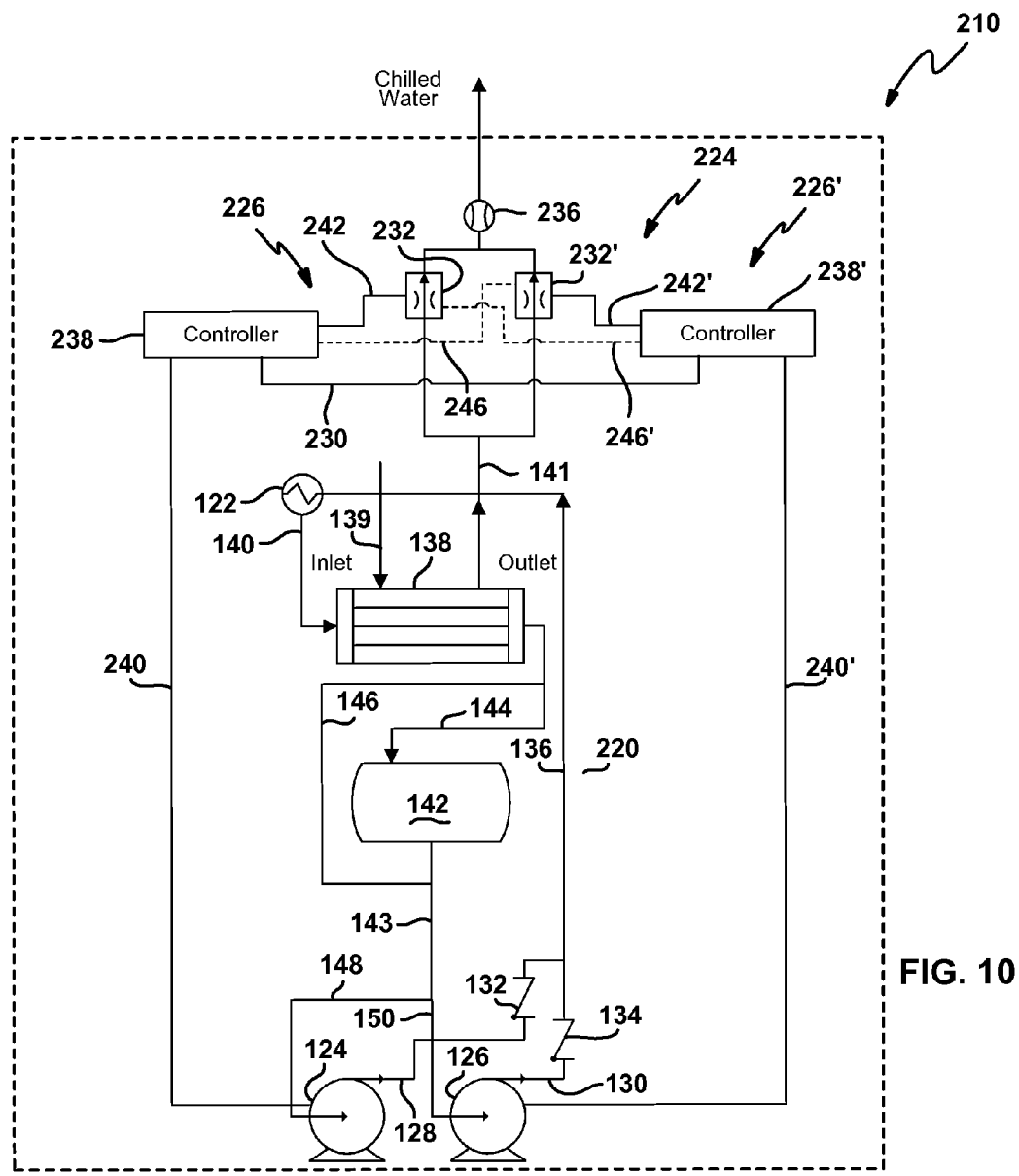
FIG. 10 is a schematic view of a pumping unit having redundant controls for chilled water flow control.

FIG. 10 depicts a cooling system 210 arranged in accordance with various embodiments. Cooling system 210 includes a pumping unit 220 for providing fluid pumped to a cooling unit (not shown in FIG. 10). Pumping unit 220 operates similarly to pumping units 120 described above. Pumping unit 220 in various embodiments includes built in redundancy and can be a pair of dual or parallel pumping units, valves, and controllers sharing a common condenser and receiver.

Pumping unit 220 provides pumped fluid through output line 136 to a cooling unit or load 122. The cooling unit is placed in an environment where it is desirable to remove heat from the environment in which the cooling unit is situated by transferring the heat to the fluid pumped through output line 136. As described above, fluid from output line 136 enters the cooling unit at a first temperature and exits the cooling unit via line 140 at an elevated temperature. Fluid pumped through the cooling unit may also change phase from a liquid phase to a gaseous phase.

Also shown in FIG. 10 are chilled water inlet line 139 and chilled water outlet line 141. Chilled water is input to condenser 138 via input line 139. Chilled water is supplied from a chilled water source (not shown in FIG. 10), such as building chilled water. Chilled water passes through condenser 138 to effect a heat transfer from fluid circulated through condenser 138 via outlet line 136 and inlet line 140. Chilled water exits condenser 138 via chilled water outlet line 141.

Chilled water outlet line 141 connects to redundant sensing and control circuit 224 having first circuit branch 226 and second, redundant circuit branch 226'. It should be noted that circuit branches 226, 226' are arranged in a generally symmetric configuration and that either circuit branch can be designated as a primary or redundant circuit branch or may be referred to as operating and dormant circuit branches respectively. Each circuit branch 226, 226' includes a pair of valves 232, 232' connected to chilled water outlet line 141. The output of valves 232, 232' is combined and input to a flow meter 236. In various embodiments, valves 232, 232' may be implemented as normally closed spring return valves.

In various embodiments, control circuit 224 also includes a pair of controllers 238, 238' that provide redundancy to the left and right sides of pumping unit 220. Controller 238 communicates with valve 232 via control line 242. Similarly, controller 238' communicates with valve 232' via control line 242'. Controller 238 communicates with pump 124 via control line 240. Similarly, controller 238' communicates with pump 126 via control line 240'. In various embodiments, controller 238 also includes a signal line for monitoring variable flow valve 232' via signal line 246, and controller 238' monitors the condition of variable flow valve 232 via signal line 246'. Controllers 238, 238' communicate via a connection 230, which may be either a signal or data line.

In operation, pumping unit 220 functions as a redundant operating circuit sharing a common condenser 138 and receiver 142. Controller 238, valve 232 and pump 124, and associated electrical and fluid lines comprise a first redundant portion of the circuit, and controller 238', valve 232', and pump 126 and associated electrical and fluid lines comprise a second redundant portion of the circuit. In various embodiments, selection of control between the redundant portions of the circuit occurs by controllers 238, 238' communicating over connection 230. Connection 230 may be a signal line in various embodiments or may be a data line in other embodiments. In various embodiments, controllers 238, 238' arbitrate control by generating a signal on connection 230 which maintains the other controller in a dormant state. For example, if controller 238 generates a signal on connection 230, controller 238' will be held in a dormant state so long as controller 238 generates the signal. If controller 238 ceases to generate a signal on connection 230, controller 238' will start up and correspondingly generate a signal on connection 230 which will hold controller 238 in a dormant state. In various other embodiments, controllers 238, 238' can communicate via connection 230 by exchanging data to arbitrate control of pumping unit 220.

In various embodiments, controller 238 can control and monitor respective portions of its redundant circuit, including valve 232, pumping unit 124, and associated connection and control lines. Controller 238' can similarly monitor components for its respective portion of the redundant circuit. If controller 238 detects a fault in any of its respective circuit components, including a fault within the controller itself, controller 238 can shut down, thereby passing control to controller 238'. Controller 238' operates similarly and activates controller 238 when controller 238' detects a fault in its respective redundant circuit portion.

In various embodiments, controllers 238, 238' control respective valves 232, 232', pumps 124, 126 and monitor flow meter 236. In various embodiments, controller 238 monitors the flow in the opposing circuit branch 238' to determine whether an interruption in flow has occurred. Likewise, in various embodiments controller 238' monitors fluid flow in the opposing circuit branch 238 to determine whether an interruption in flow has occurred. If an interruption occurs, the opposing control circuit becomes active. By way of nonlimiting example, controller 238 controls valve 232. Controller 238 also monitors operation of flow valve 232' via signal line 246. Controller 238 operates to control the flow through flow valve 232. Controller 238' operates similarly with respect to valve 230', and valve 232. Similarly controller 238' controls valve 232'. Controller 238' also monitors operation of flow valve 232 via signal line 246'. Controller 238' operates to control the flow through flow valve 232'.

In various embodiments, controllers 238, 238' can control fluid flow through respective circuit branches 226, 226' and operate either individually or cooperatively to control the fluid flow in outlet line 141. In various embodiments, one of controllers 238, 238' can control fluid flow through its respective circuit branch 226, 226'. If a failure should occur in any of the circuit branch elements associated with a particular controller, fluid flow control can be assumed and controlled by the other controller using the other circuit branch. In such various embodiments, fluid flows through only one of the circuit branches 226, 226'.

In various other embodiments, fluid flow can occur through each of respective circuit branches 226, 226' so that the combined flow provides a desired fluid flow through chilled water outlet line 141. In such various embodiments, fluid flow can be split so approximately half of the fluid flow occurs through one circuit branch 226 and the other half of the fluid flow occurs through circuit branch 226', thereby combining for a desired total fluid flow through chilled water outlet line 141. If either circuit branch 226, 226' experiences failure, that circuit branch can be disabled by its respective controller, and fluid flow through the other circuit branch can be increased to maintain a desired fluid flow through chilled water outlet line 141.

Figure 11:
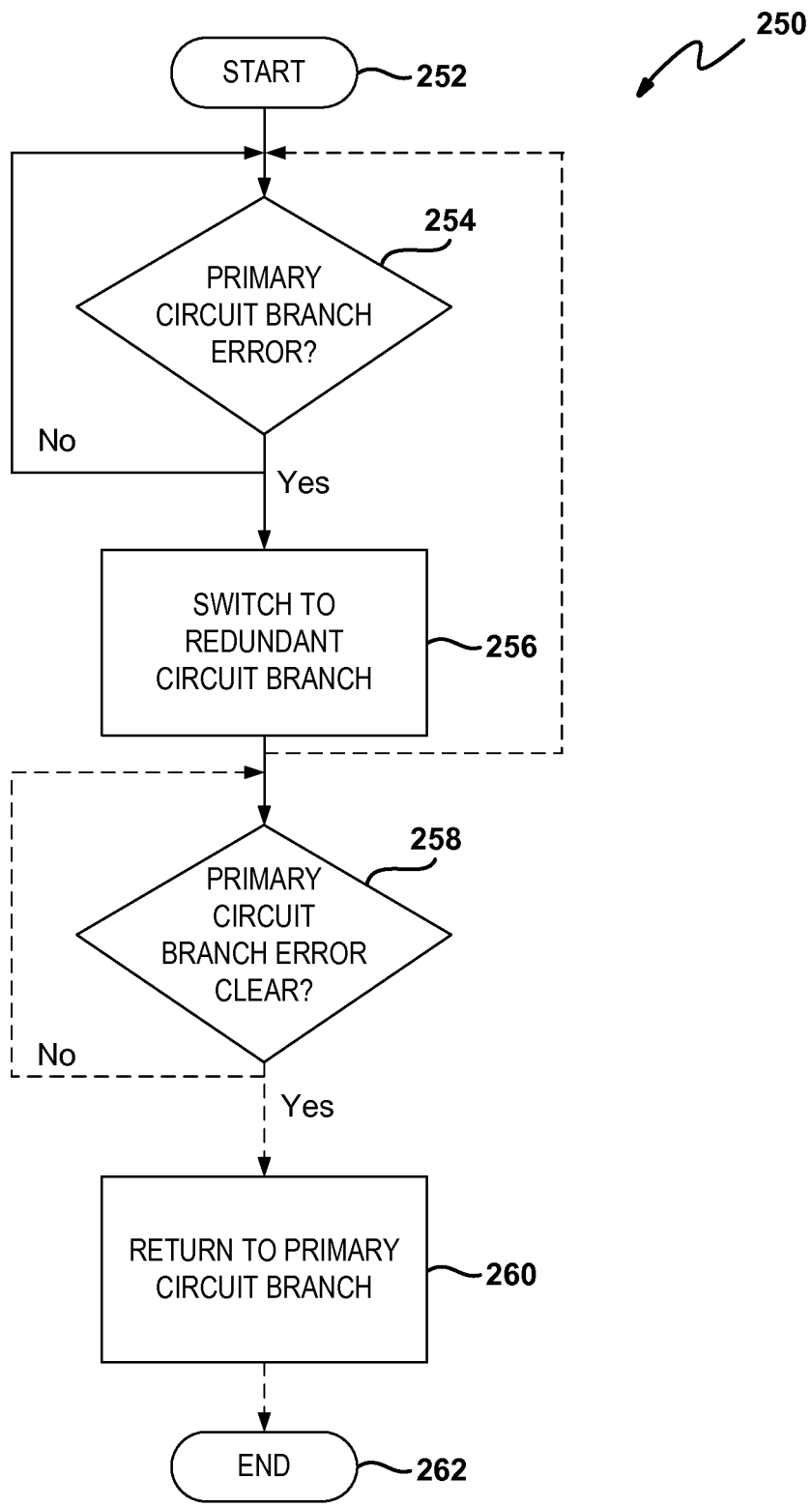
FIG. 11 is a flow diagram depicting a process for implementing redundant chilled water flow control.

FIG. 11 depicts a flow diagram 250 demonstrating operation of a redundant circuit branch implementation of FIG. 10. Control begins at start block 252 and proceeds to decision block 254. At decision block 254, a test is performed to determine if an error exists in the primary circuit branch. The primary circuit branch can be determined arbitrarily as one of the circuit branches 226, 226', leaving the remaining circuit branch as the redundant, secondary, or other circuit branch. It will be assumed that circuit branch 226 is the primary circuit branch. If no error has occurred in primary circuit branch 226, control proceeds back to decision block 254 where the test is repeated. If an error has occurred in primary circuit branch 226, control proceeds to block 256 where a switch occurs to secondary circuit branch 226'. In various embodiments, the switch can be effected by controller 238 shutting down, causing controller 238' to begin operation. In various other embodiments, control can end and return to 254. In various embodiments, control then proceeds to block 258 where a test is performed to determine if the circuit branch error has cleared. If not, control returns to block 258 where the test is repeated. If the error has cleared, control proceeds to block 260. At block 260, a return to the primary circuit branch is effected by opening the respective shut off valve 230 and variable flow valve 232 and closing secondary valve 230' and closing or reducing fluid flow through secondary flow valve 232'. Control then proceeds to block 262 where the process is completed.

Figure 12:
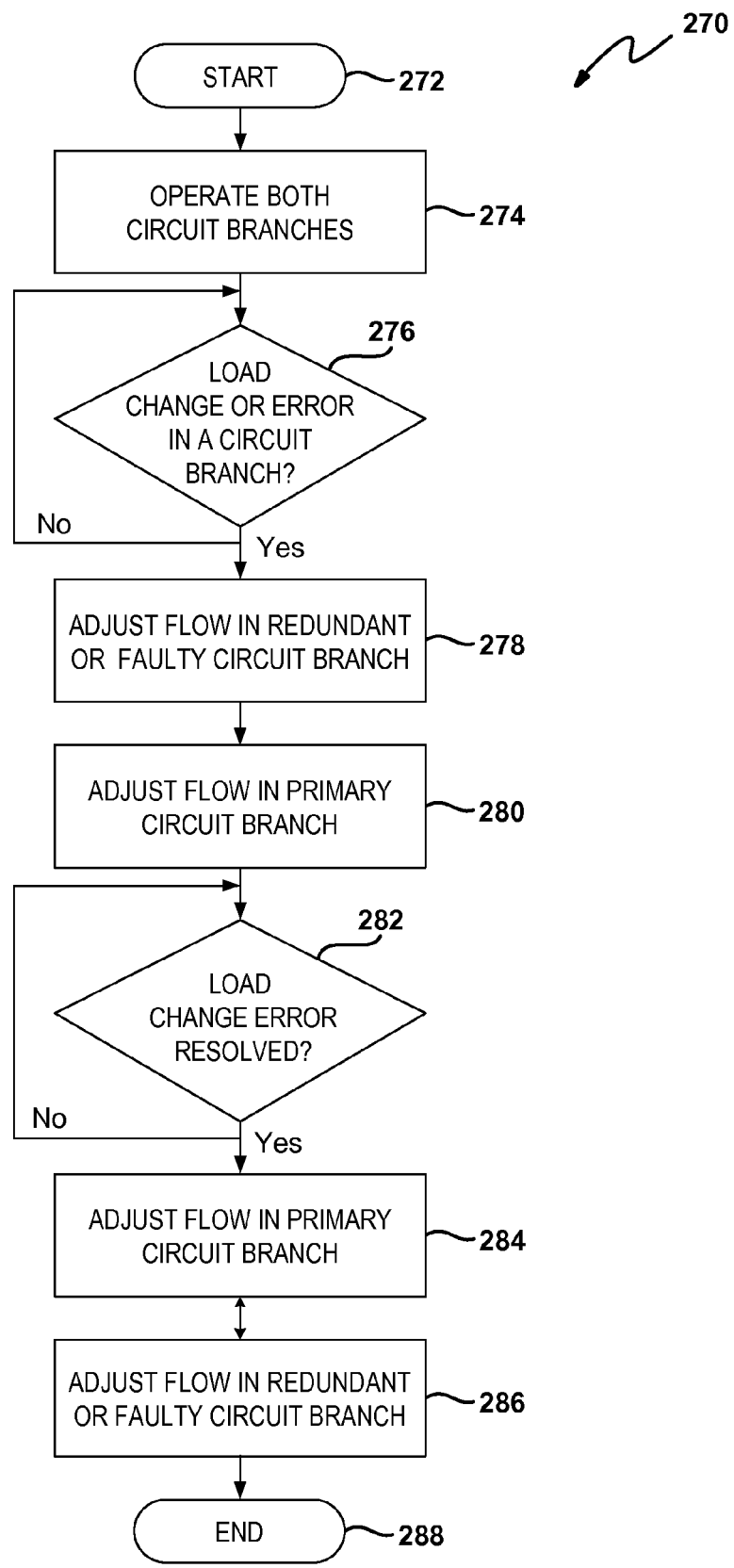
FIG. 12 is a flow diagram depicting a second process for implementing redundant chilled water flow control.

FIG. 12 depicts a block diagram 270 directed a redundant scenario when both circuit branches 226, 226' of FIG. 10 each provide a portion of the fluid flow through chilled water outlet line 141. Control begins at start block 272 and proceeds to block 274 which operates both circuits branches to (equally or unequally) share the flow through chilled water outlet line 141. Control then proceeds to decision block 276 which performs a test to determine if a load change error exists in one of the two circuit branches 226, 226'. If no load change or error has been detected, control proceeds back to decision block 276 which repeats the test. If a load change or error is detected, control proceeds to block 278 where the flow is adjusted in the redundant or faulty circuit branch by controlling the associated pumps and valves. Control proceeds to block 280 where fluid flow in the primary circuit is adjusted to maintain the flow through chilled water outlet line 141 at a desired rate. Control proceeds to block 282 where a test is performed to determine if the error in the faulty circuit branch has been resolved. If the load change or error has not been resolved, control proceeds back to test block 282 where the test is repeated. If the load change error has been resolved, control proceeds to block 284 where fluid flow through the primary circuit branch is adjusted. Control proceeds to block 286 where the flow through the redundant circuit branch is adjusted so that both circuit branches 226, 226' share the fluid flow through outlet line 141. Control next proceeds to block 288 where the process is completed.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

What is claimed is:

1. A cooling system comprising:
a primary cooling module comprising a first pump circulating refrigerant, the first pump supplying the refrigerant to an evaporator at a first temperature and a first condenser receiving the refrigerant from the evaporator, the refrigerant received by the first condenser being at a higher temperature than the first temperature, the primary cooling module circulating refrigerant through an evaporator;
a first liquid receiver associated with the primary cooling module and receiving the refrigerant in a liquid state; and
a secondary cooling module comprising a second pump circulating the refrigerant, a second condenser and a second liquid receiver, the second condenser receiving refrigerant from the evaporator and the second liquid receiver receiving the refrigerant in a liquid state from the second condenser,
a first controller configured to activate the secondary cooling module upon detection of a deficiency of the primary cooling module, in which the secondary cooling module replaces the primary cooling module by providing flow of the refrigerant from the secondary cooling module through the evaporator while the primary module is deactivated; and
the first controller is further configured such that upon activation of the secondary cooling module, the first controller enables fluid flow through a receiver link, said receiver link fluidly connecting the first liquid receiver to the second liquid receiver, to equalize pressure between the first liquid receiver and the second liquid receiver.

2. The cooling system of claim 1 further comprising a receiver valve arranged in the receiver link between the first liquid receiver and the second liquid receiver to control fluid flow between the first liquid receiver and the liquid second receiver by means of the first controller.

3. The cooling system of claim 1 further comprising:
an inlet valve for controlling fluid flow between an inlet of the evaporator and one of the primary cooling module and the secondary cooling module; and
an outlet valve for controlling fluid flow between an outlet of the evaporator and one of the primary cooling module and the secondary cooling module.

4. The cooling system of claim 1 further comprising:
a first valve having an inlet connected to a chilled water outlet line of the condenser;
a second valve in parallel with the first valve and having an inlet connected to the chilled water outlet line of the condenser; and
a second controller associated with the second valve,
wherein the first controller is associated with the first valve, and
wherein in a first mode, the first controller controls the first valve, and the second controller controls the second valve, and in a second mode, one of the first controller or the second controller controls one of the second valve or the first valve.

5. The cooling system of claim 4 wherein the first controller is associated with the first pump and the second controller is associated with a third pump, wherein the first pump, the first valve, and the first controller form a first circuit and the third pump, the second valve, and the second controller form a second circuit, and the first and second circuits cooperate to redundantly control the cooling system.

6. The cooling system of claim 4 wherein the first controller and the second controller communicate via an electrical connection.

7. The cooling system of claim 6 wherein when one of the first controller or the second controller initiates communication between each other, the one controller of the first controller or the second controller initiating communication controls components of the cooling system and the other of the first controller or the second controller is inhibited from controlling components of the cooling system.

8. The cooling system of claim 4 wherein the first controller and the second controller communicate to determine which controller controls particular components of the cooling system.

9. The cooling system of claim 4 wherein the first controller monitors a condition of at least one of the second valve or a third pump, and the second controller monitors the condition of at least one of the first valve or the first pump.

* * * * *